(12) United States Patent
Pfefferle et al.

(10) Patent No.: US 7,258,807 B2
(45) Date of Patent: Aug. 21, 2007

(54) CONTROLLED GROWTH OF GALLIUM NITRIDE NANOSTRUCTURES

(75) Inventors: Lisa Pfefferle, Branford, CT (US); Dragos Ciuparu, New Haven, CT (US); Jung Han, Woodbridge, CT (US); Gary Haller, New Haven, CT (US)

(73) Assignee: Yale University, New Haven, CT (US)

( * ) Notice: Subject to any disclaimer, the term of this patent is extended or adjusted under 35 U.S.C. 154(b) by 68 days.

(21) Appl. No.: 11/011,629

(22) Filed: Dec. 13, 2004

(65) Prior Publication Data

US 2005/0176249 A1 Aug. 11, 2005

Related U.S. Application Data

(60) Provisional application No. 60/529,430, filed on Dec. 12, 2003.

(51) Int. Cl.
 *B82B 3/00* (2006.01)
(52) U.S. Cl. .............................. 216/11; 216/37; 117/87; 977/891; 977/893; 977/816
(58) Field of Classification Search .................... None
 See application file for complete search history.

(56) References Cited

U.S. PATENT DOCUMENTS 5,780,680 A * 7/1998 Eller et al. .................. 564/485
6,333,016 B1 12/2001 Resasco et al.
6,472,802 B1 * 10/2002 Choi et al. .................. 313/309
6,733,828 B2 * 5/2004 Chao et al. .................. 427/239
6,896,864 B2 5/2005 Clarke
2002/0130311 A1 9/2002 Lieber et al.
2005/0230688 A1 * 10/2005 Lee ............................. 257/79
2006/0115595 A1 * 6/2006 Shenai-Khatkhate et al. .... 427/248.1

OTHER PUBLICATIONS

L. B. McCusker, F. Liebau, and G. Engelhardt; Nomenclature of Structural and Compositional Characteristics of Ordered Microporous and Mesoporous Materials with Inorganic Hosts © IUPAC Recommendations 2001; Pure and Applied Chemistry, vol. 73, No. 2 pp. 381-394, 2001.*

Jung-Han and Arto V. Nurmikko, III-Nitride Zero- and One-Dimensional Nanostructures by MOCVD, Invited Talk at Symposium on Nanostryctue Science and Technology, (NST) Aug. 13, 2004.*

(Continued)

*Primary Examiner*—Allan Olsen
(74) *Attorney, Agent, or Firm*—Fish & Neave IP Group Ropes & Gray, LLP

(57) ABSTRACT

A transition metal substituted, amorphous mesoporous silica framework with a high degree of structural order and a narrow pore diameter distribution (±0.15 nm FWHM) was synthesized and used for the templated growth of GaN nanostructures, such as single wall nanotubes, nanopipes and nanowires. The physical properties of the GaN nanostructures (diameter, diameter distribution, electronic characteristic) can be controlled by the template pore diameter and the pore wall chemistry. GaN nanostructures can find applications, for example, in nanoscale electronic devices, such as field-emitters, and in chemical sensors.

22 Claims, 5 Drawing Sheets

OTHER PUBLICATIONS

Winkler, et al., "Quantum-Confined Gallium Nitride in MCM-41" Advanced Material 11(17): 1444-1448 (1999).

Cheng, et al., "Ordered nanostructure of single-crystalline GaN nanowires in a honeycomb structure of anodic alumina" Journal of Materials Research Mater. Res. Soc USA, 15(2):347-350 (2000).

Jung Han, et al., III-Nitride Zero- and One-Dimensional Nanostructures by MOCVD Korean Conference Proceeding XP002330543 Retrieved from the Internet: URL:https://www/ksea.org/ukc2004/en/Proceedings/04NST/NST31_UKC_Invited?Talk?jhan.pdf. (2004).

Parala, et al., "Synthesis of GaN particles in porous matrices by chemical vapor infiltration of single molecule precursors" Abstract and Journal de Physique IV, Database Accession No. 7149448, 11(3): pr3-473 (2001).

Lim et al., "Synthesis and Characterization of Highly Ordered Co-MCM-41 for Production of Aligned Single Walled Carbon Nanotubes (SWNT)," J. Phys. Chem. B, 107:11048-11056, (2003).

Lim et al., "Preparation of Highly Ordered Vanadium-Substituted MCM-41: Stability and Acidic Properties," J. Phys. Chem. B., 106:8437-8448, (2002).

Oye et al., "A multivariate analysis of the synthesis conditions of mesoporous materials," Microporous and Mesoporous, 34:291-299, (2000).

Yang et al., "Multivariate correlation and prediction of the synthesis of vanadium substituted mesoporous molecular sieves," Microporous and Mesoporous Materials, 67:245-257, (2004).

Li et al., "Large-Scale Synthesis of Aligned Carbon Nanotubes," Science, 274:1701-1703, (1996).

* cited by examiner

CONTROLLED GROWTH OF GALLIUM NITRIDE NANOSTRUCTURES

CROSS-REFERENCE TO OTHER PATENT APPLICATIONS

This application claims the benefit of U.S. provisional Patent Application No. 60/529,430, filed Dec. 12, 2003, the subject matter of which is incorporated herein by reference in its entirety.

BACKGROUND OF THE INVENTION

Gallium nitride (GaN) is a refractory semiconducting material with a wide optical bandgap and can be doped n-type and p-type. More particularly, light emitting devices, such as light-emitting diodes (LED) and diode lasers, have met with an overwhelming commercial success, with LEDs now increasingly replacing inefficient incandescent lamps and even fluorescent lighting fixtures. In addition, GaN has a low electron affinity ($\cong 2.7$ eV) as well as a high chemical and mechanical stability and has therefore attracted attention as a material for field emission devices. Field emission cathodes fabricated from GaN should have longer lifetimes because of their high sputtering resistance and low sensitivity to residual gases, especially oxygen.

The emission current from a field emission cathode depends on the electric field at the tip of the field emitter. Decreasing the size of the tip by using nanotips as an electron source can significantly reduce power consumption of a display device. The use of nanotip electron sources also reduces the form factor of the display.

For these and other reasons that will become apparent, it would be desirable to provide a process that produces GaN nanostructures, such as nanotubes and nanowires, with controlled chemical and physical properties.

It would also be desirable to produce nanoscale devices for electronic and sensing applications that incorporate such GaN nanostructures.

SUMMARY OF THE INVENTION

The invention, in one aspect, is directed to the growth of GaN nanostructures with controllable physical properties, such as a predetermined diameter and a narrow diameter distribution, in or on a catalytic template or catalytic framework. The prepared GaN nanostructures can have well-defined electrical and/or optical characteristics and/or a selective response in the presence of foreign molecules.

According to one aspect of the invention, a method for producing a GaN nanostructure, includes the acts of providing a framework of a mesoporous siliceous structure having pores with a predetermined diameter and containing a catalytic metal disposed in the pores, and exposing the framework to a gallium-containing reactant and a nitrogen-containing reactant at a predetermined temperature. The produced GaN nanostructure has a diameter or cross-sectional area that correlates with the predetermined pore diameter. Embodiments of the invention may include one or more of the following features. The predetermined temperature can be in a range between approximately 700° C. and 1000° C., preferably between 750° C. and 950° C. The catalytic metal can be an element from the Group VIII of the periodic system, for example, Fe, Co and/or Ni, with a concentration between 0.1 and 10 wt %, preferably 0.5 and 5 wt %.

The mesoporous siliceous structure can be formed of MCM-41 and have a pore diameter between 1 nm and 10 nm. The framework for the growth of GaN nanostructures can be prepared by mixing siliceous MCM-41 with boehmite ($\gamma$-AlOOH), placing the mixture on a support, such as a silicon wafer, and calcining the supported mixture. The reactant can include a metal, such as gallium metal, a metal halide, such as $GaCl_3$, or a metalorganic compound, such as trimethyl-gallium, triethyl-gallium and/or gallium acetyl acetonate, whereas the nitrogen-containing reactant can be ammonia.

The produced nanostructure can include nanotubes, nanowires, nanopipes and/or nanotrees. The diameter or lateral size of the nanotubes appears to be determined by catalytic sites produced in the pores by the catalytic metal dispersed in the mesoporous siliceous framework, wherein the size of the catalytic sites in the pores is determined by the quantity of catalytic metal ions in the mesoporous siliceous framework. The nanotube diameter tends to be smaller than the geometric pore diameter. Conversely, the nanowire diameter is substantially identical to the predetermined pore diameter.

A dendritic GaN "tree" nanostructure having a "trunk" and "branches" can be grown by exposing the produced GaN nanostructure to gallium or indium vapors and then re-exposing it to the metalorganic gallium-containing reactant and the nitrogen-containing reactant, optionally adding a metalorganic indium-containing reactant. Optionally, the framework can be exposed to hydrogen and/or to gallium or indium vapor before growing the "branches."

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF CERTAIN ILLUSTRATED EMBODIMENTS

Figure 1A:
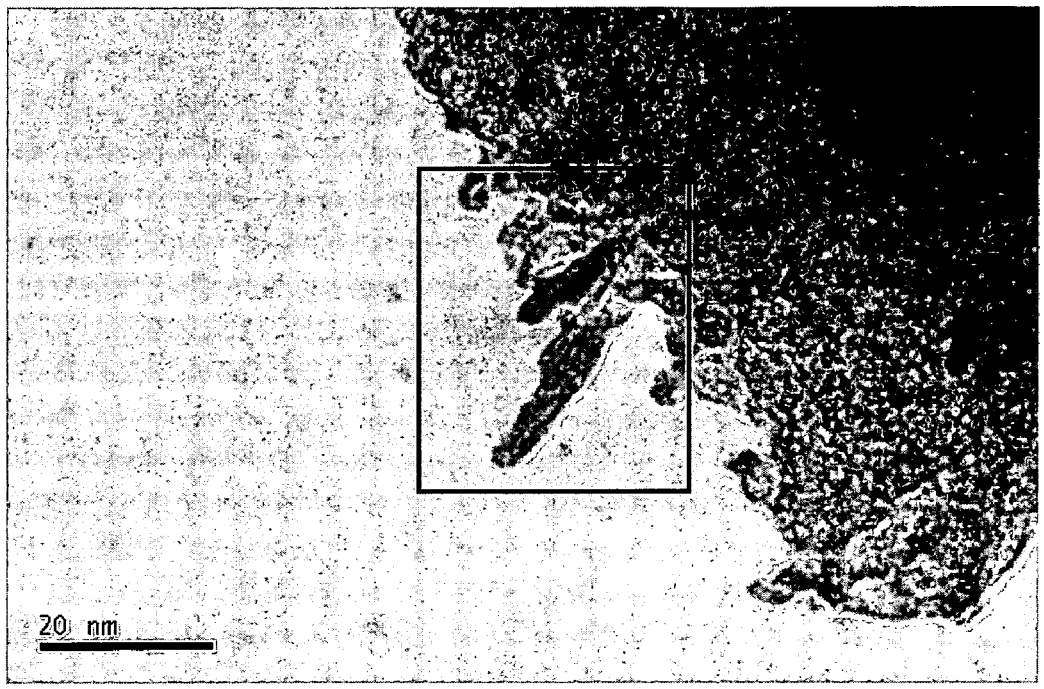
FIG. 1A is a transmission electron microscopic (TEM) image of GaN nanostructures produced in pre-reduced catalyst.
Figure 1B:
FIG. 1B shows a close-up of the region of FIG. 1 enclosed in the box.

The invention is directed, inter alia, to a method for growth of GaN nanostructures in on mesoporous molecular sieve (MPMS) catalytic templates with catalyst components incorporated into the wall framework, providing high uniformity control of the diameter, the structure, and the diameter distribution of nanotubes and nanowires. This enables control over the optical and electronic properties of the material and hence also of devices prepared from the material.

To date, only thick-walled GaN nanopipes with a wall thickness of between 10 nm and 30 nm have been produced. These large-diameter structures exhibit three-dimensional electronic properties. Conversely, thin-wall GaN nanotubes, in particular single-wall nanotubes (SWNT) and nanowires with diameters of less than 3 nm, can exhibit low-dimensional (one- and two-dimensional) electronic properties that are controlled by size rather than by chemistry. For example, GaN SWNT have been predicted to be optically active in the visible with wavelength tunability by diameter as well as doping, with potential applications, for example, as microlasers (wavelength controlled by SWNT diameter), optical communication, as a thermoelectric material or a catalyst for photolytic production of hydrogen.

It is a realization of the inventors that a metal-substituted mesoporous framework of the Mobil M41S class (MCM-41 and MCM-48) with metal ions suitably incorporated in the framework as the source for the catalytic sites can be used to produce, using chemical vapor deposition (CVD) techniques, ordered GaN nanowires and SWNT with controlled diameters between 2 and 10 nm and a narrow diameter distribution.

According to the IUPAC definition, mesoporous materials are referred to as materials having pores with diameters in a range between about 2.0 nm and 50 nm, whereas materials having pores with diameters of less than 2 nm are referred to as microporous. U.S. Pat. No. 5,538,711 defines a "mesoporous range" encompassing pore sizes between 1.3 and 20 nm. For the purpose of this application, "mesoporous materials" are defined as materials having pores with diameters between 1 nm and 20 nm. The term "pore diameter" hereinafter shall refer to an average lateral dimension or width of the pores, in the event that the pores are not perfectly circular. Unlike zeolites which are crystalline materials so that their pore diameter cannot be varied independent of the composition, the M41S class mesoporous materials (MCM-41 and MCM-48) developed by Mobil Oil Corporation has a structured pore arrangement with pore diameters ranging from 1.5–4 nm wherein the pore walls are amorphous. The pore structure and pore diameter can be produced independent of the substitution of transition metal ions in the framework (for dilute substitutions). A uniform pore distribution and pore diameter (~0.1 nm FWHM uniformity in the pore diameter) can be achieved through careful control of the growth process, which will be described below. Both the chemical composition and the pore diameter have been found to play a role in determining the structure of GaN nanotubes formed in the pores.

EXAMPLE

Synthesis of the Catalytic Framework

As catalytic framework for the controlled growth of GaN nanotubes, MCM-41 with Fe, Co, and Ni framework substitutions was synthesized with a well-defined uniform pore diameter between approximately 1.5–4 nm.

Silica sources were HiSil-915 from Pittsburgh Plate Glass (PPG), and tetramethylammonium silicate (10 wt % silica, SACHEM Inc.). The metal sources used were $CoSO_4 \cdot xH_2O$ (Aldrich Chemical Co.), $Fe(SO_4) \cdot 7H_2O$ (Fisher Scientific Co.), $Fe(NO_3)_3 \cdot 9H_2O$ (Sigma Co.), and $Ni(NO_3)_2 \cdot 6H_2O$ (Aldrich Chemical Co.). Quaternary ammonium surfactants $C_nH_{2n+1}(CH_3)_3NBr$ were obtained from Sigma Co. with $n=12, 14, 16$ and from American Tokyo Kasei with $n=10$. Surfactant solutions were prepared by ion-exchanging a 29 wt % of $C_nH_{2n+1}(CH_3)_3NBr$ aqueous solution with equal molar exchange capacity of Amberjet-400 (OH) ion-exchange resin (Sigma Co.) by overnight batch mixing. The anti-foaming agent was Antifoam A from Sigma Co., a silane polymer alkyl terminated by methoxy groups. Acetic acid (Fisher Scientific) was used for pH adjustment of the synthesis solution. The pH was maintained at $11\pm0.1$.

Aqueous solutions of HiSil-915, tetramethyl-ammonium silicate and the metal precursor (M=Fe, Co, and/or Ni) were mixed for 30 min with 50 ml of deionized water. The water-to-silicon ratio was varied from a $H_2O/Si$ mole ratio=74.4 to 86, based on the surfactant chain length. The surfactant solution was added to the prepared mixture of silica and metal and a small amount of anti-foaming agent (0.2 wt % of surfactant) was incorporated to remove excess foam produced by the surfactant. Acetic acid was added to maintain pH=$11\pm0.1$. The molar ratio of each component in the synthesis solution was controlled at $SiO_2$:surfactant:M:$H_2O$=1:0.27:0.017:X (X=74.4~86). After additional mixing for about 30 min, this synthesis solution was poured into a polypropylene bottle and placed in the autoclave at 100° C. for 6 days. After cooling to room temperature, the resulting solid was recovered by filtration, washed with deionized water and dried under ambient conditions.

The substituted Fe, Co, and Ni is initially more or less atomically dispersed in the silica framework, with particles less than 1 nm (as measured by EXAFS). The ultimate size of catalyst particles formed in the pores of the framework during synthesis is substantially determined by the template pore diameter and the synthesis conditions. Stated differently, larger pores tend to produce larger catalyst particles.

Before the growth of the GaN nanotubes, the powder catalyst was finely mixed with boehmite (γ-AlOOH) sols and brushed on silicon wafer chips. The resulting catalyst was dried at room temperature and calcined at 550° C. for 6 hours under flowing air. The GaN synthesis is not expected to be sensitive to how the substituted MCM-41 is supported in the reactor.

Synthesis of GaN Nanotubes and Nanowires

The controlled pore diameter and wall chemistry of the MCM-41 catalytic templates are relevant for the control of physical properties, such as nanotube diameter and optical/electronic properties, of the produced GaN nanostructures. All catalysts produced technologically interesting structures. The Ni-MCM-41 catalyst was found to produce the greatest selectivity for single-walled nanotubes structures. Several types of GaN structures, such as single wall nanotubes, nanopipes (thick wall) and nanowires (solid core) were observed. It should be noted, however, that the nanowires and nanotubes produced with the disclosed process tend to have a smaller diameter and have a more uniform diameter distribution than GaN nanostructures produced by prior art processes.

GaN nanostructures (wires and tubes) were synthesized using two different techniques: (1) synthesis in a traditional flow reactor at pressures between 1–10atm; and (2) low-pressure metalorganic chemical vapor deposition (LP-MOCVD) at pressures between 10–200Torr. This represents a wide variation of synthesis conditions, such as temperature, pressure, contacting of reagents, different template compositions and precursors. Although much work has been reported for the synthesis of GaN nanowires and nanopipes, only scant attention has been paid to optimizing the reaction configuration/conditions to achieve a particular type of nanostructure, i.e., nanotube vs. nanowire. For example, in one technique, metal-substituted MCM-41, for example Ni-MCM-41, was exposed to Ga precursors (for example, trimethyl gallium) and nitrogen precursors (for example, ammonia) from the gas phase. In another technique, indium and/or gallium is deposited onto a patterned substrate (such as an MCM-41 film) and exposed to ammonia in the gas phase as the nitrogen precursor.

The optimal temperature for production of GaN nanowires using nanostructured frameworks, such as the metal-substituted MCM-41, appears to vary between 750° C. and 950° C. This is a low enough temperature range so as to prevent a loss of the framework structure, which is likely to occur above 950° C.

Example 1

For a typical run in a low-pressure CVD reactor, the metal-substituted MCM-41 framework was reduced in hydrogen for 30 minutes at 500° C. prior to exposure to the reactants. The exemplary framework had a pore diameter of approximately 3 nm. Analysis by X-ray absorption spectroscopy showed that the hydrogen treatment slightly reduces the framework. The framework is then exposed to a mixture of nitrogen with 10% hydrogen and 2–5 µmol/min trimethyl gallium and 10–15 sccm ammonia. The framework was held at a steady temperature of between 800° C. and 1000° C., preferably 950° C., and exposed to reactants for between 5 minutes and 90 minutes, preferably for one hour. Pressures in the CVD reactor ranged from 50 mbar to 1 atmosphere.

Although all the catalysts (Fe, Co, Ni) incorporated in the MCM-41 framework produced interesting structures, Ni-MCM-41 produced the highest selectivity for small diameter GaN nanotubes. The produced GaN nanotubes had a diameter on the order of 1 nm, which is smaller than the physical pore diameter of the framework of 3 nm, suggesting that the diameter of the GaN nanotubes is controlled by the size of the catalytic nucleation site (catalytic particle size) formed inside the pore from the catalyst atoms disposed in or on the pore walls, rather than be the pore diameter itself. The process for the growth of GaN nanotubes of controlled and uniform diameter appears therefore to be similar to the process that was successfully applied to the grow of aligned single walled carbon nanotubes with a uniform diameter, as described, for example, in commonly assigned U.S. patent application Ser. No. 10/328857, filed Dec. 18, 2002, and U.S. patent application Ser. No. 10/726394, filed Dec. 2, 2003, the contents of which are incorporated herein by reference in their entirety.

Example 2

Nanowires with diameters on the order of 3 nm were also produced under the same growth conditions as those of Example 1. However, the diameter of the nanowires tends to coincide with the pore diameter, suggesting a different growth kinetics than for GaN nanotubes. It should be noted, however, that at 900° C. the quantity of produced nanotubes by far exceeds the quantity of nanowires produced at temperatures higher than 950° C.

Example 3

Metal-substituted MCM-41 was "predosed" with In and/or Ga at a temperature between approximately 750° C. and 1200 C., providing nucleation sites for the growth of nanowires. The diameter of the wires is controlled by the uniform pore pattern of the MCM-41 template.

Example 4

Small GaN nanowires can be converted into nanotrees by regrowth of GaN nanostructures on nanowires that were initially produced under the conditions of Example 2. The wires are then kept on the framework and held at a temperature between approximately 750° C. and 1000° C. A boat with Ga and/or In metal is placed upstream of the framework and held at a temperature between 750° C. and 1100° C., and the metal vapor is carried downstream by a nitrogen or Argon flow to contact the as-grown nanowires. GaN nanowires, which optionally can be indium-doped, are then grown on the contacted nanowires under the same conditions as described in Example 1 above, i.e., at temperatures between 850° C. and 1000° C. in a flow of nitrogen and 10% hydrogen, 2–5 µmole/min trimethyl gallium and 10–15 sccm ammonia, with growth times ranging from 5 minutes to 90 minutes, preferably 1 hour. Pressures in the CVD reactor ranged from 50 mbar to 1 atmosphere. The nanotrees had a "trunk" in the form of a crystalline GaN nanowire and "branches" that are either in the form of nanotubes or nanowires. The growth of the GaN braches is selective, with predominantly nanotubes growing at a temperature of approximately 900° C., and predominantly nanowires growing at a slightly higher temperature of approximately 950° C. This is likely a very interesting structure as the nanotubes have a bandgap in the visible region. The III-nitride material system has direct bandgap covering the entire visible and solar spectrum. The electrochemical potential profiles in such a nanotree system can be designed for effective transfer and conversion of solar energy from branches, having very high surface areas, to the electrically connected trunks. GaN nanostructures, such as the aforedescribed nanotrees, may also become important as catalysts supports/co-catalysts for the photo-catalytic production of hydrogen.

Figure 2:
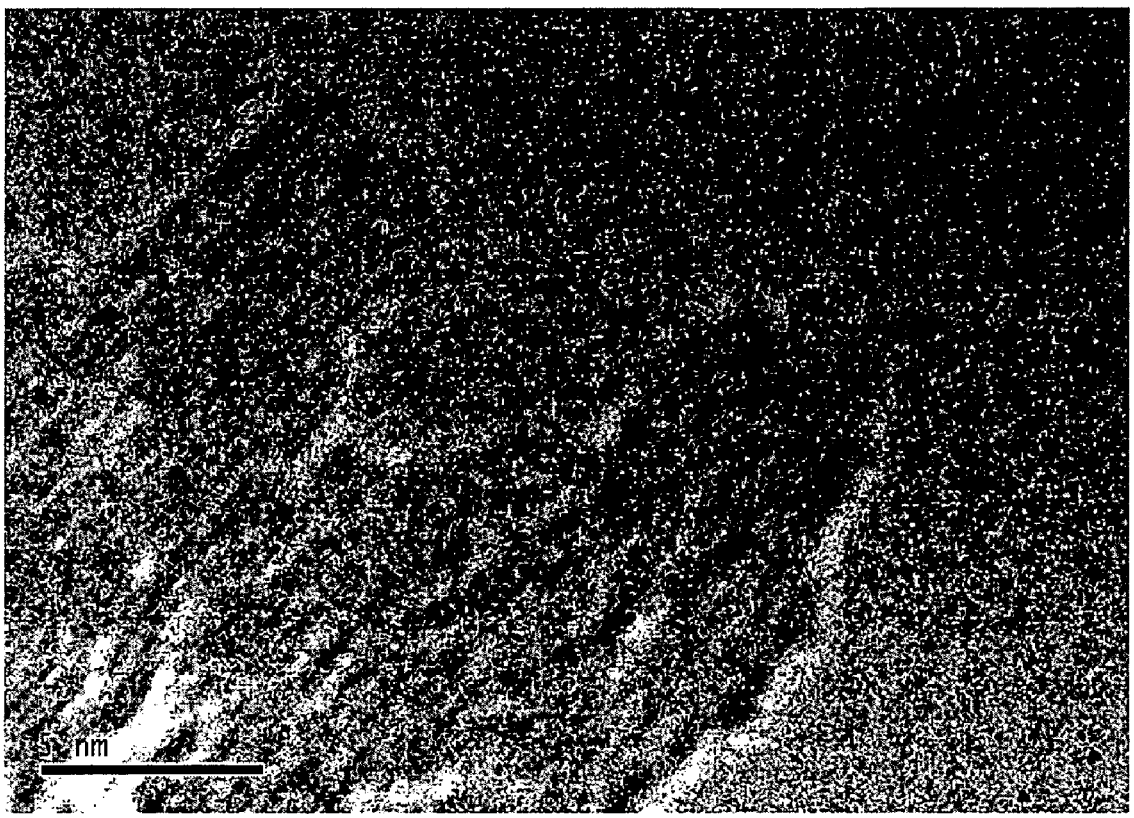
FIG. 2 shows two arrays of GaN nanotubes. The structure on the lower right was damaged by the electron beam of the TEM microscope.

FIG. 1A shows a TEM micrograph GaN nanostructures grown on a pre-reduced Ni-MCM-41 framework wit pores sizes of approximately 3 nm, with FIG. 1A showing a detail of the as-grown GaN nanostructures. FIG. 2 shows a TEM micrograph of two bundles of GaN nanotubes wherein each nanotube has a diameter of approximately 0.9 nm. The bundle in the upper left of the image appears to have been damaged during the TEM analysis.

Figure 3:
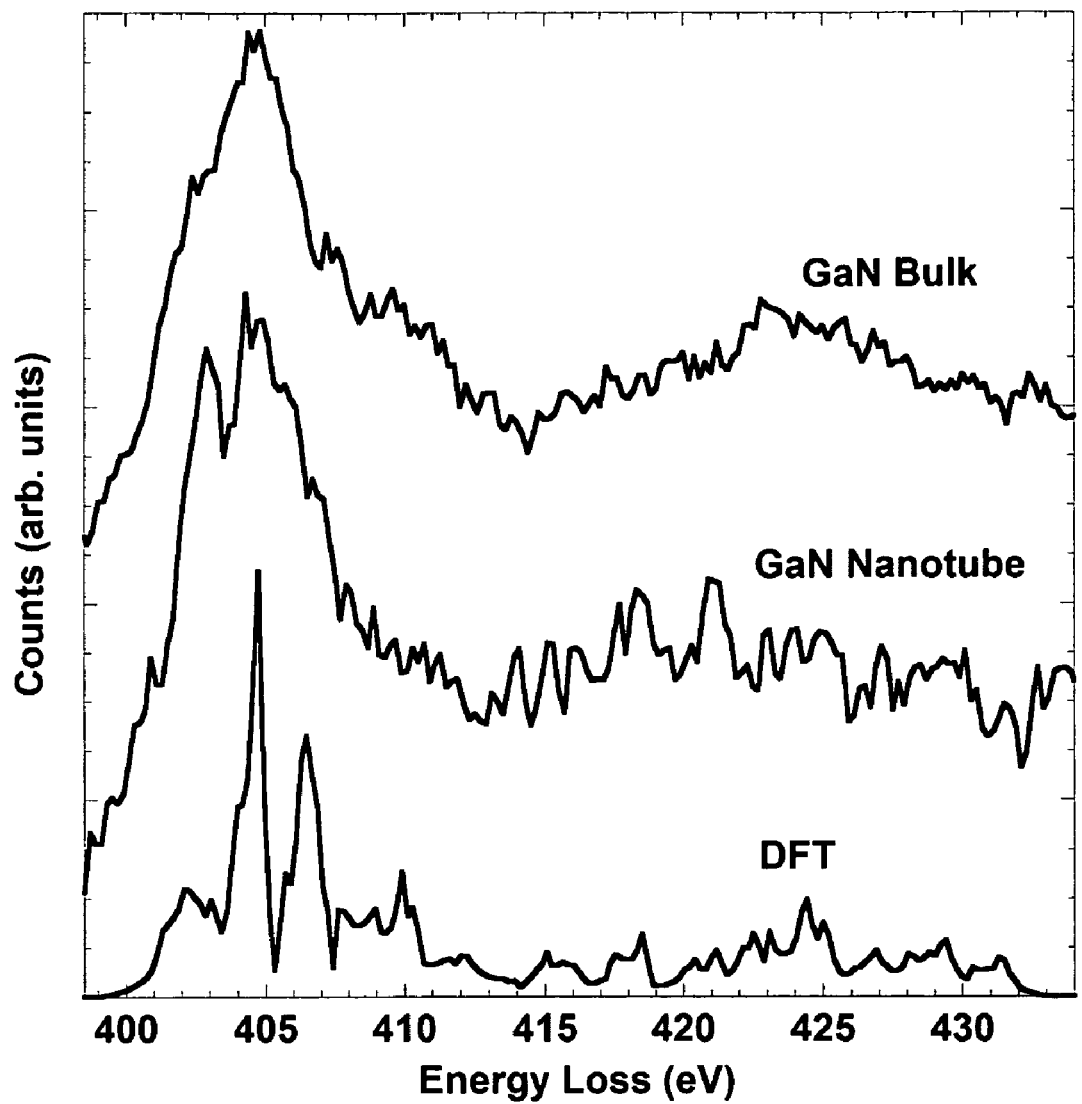
FIG. 3 shows a Electron Energy Loss spectrum for a GaN epitaxial layer (top), and a GaN nanotube sample (middle). The bottom trace is a calculated spectrum for a single walled GaN nanotube based on Density Functional Theory (DFT)

FIG. 3 shows Electron Energy Loss spectra obtained on these samples, with the recorded spectral features strongly indicating that these structures are indeed single-walled nanotubes (SWNT). The spectra in FIG. 3 represent an epitaxial layer of GaN (curve a) considered to be bulk GaN; GaN nanotubes (curve b); and a calculated spectrum based on Density Function Theory (DFT) (curve c). The presence of peak splitting predicated by the DFT calculation was unambiguously observed for the GaN nanotube sample (curve b), providing conclusive evidence for the presence of GaN nanotubes.

Figure 4:
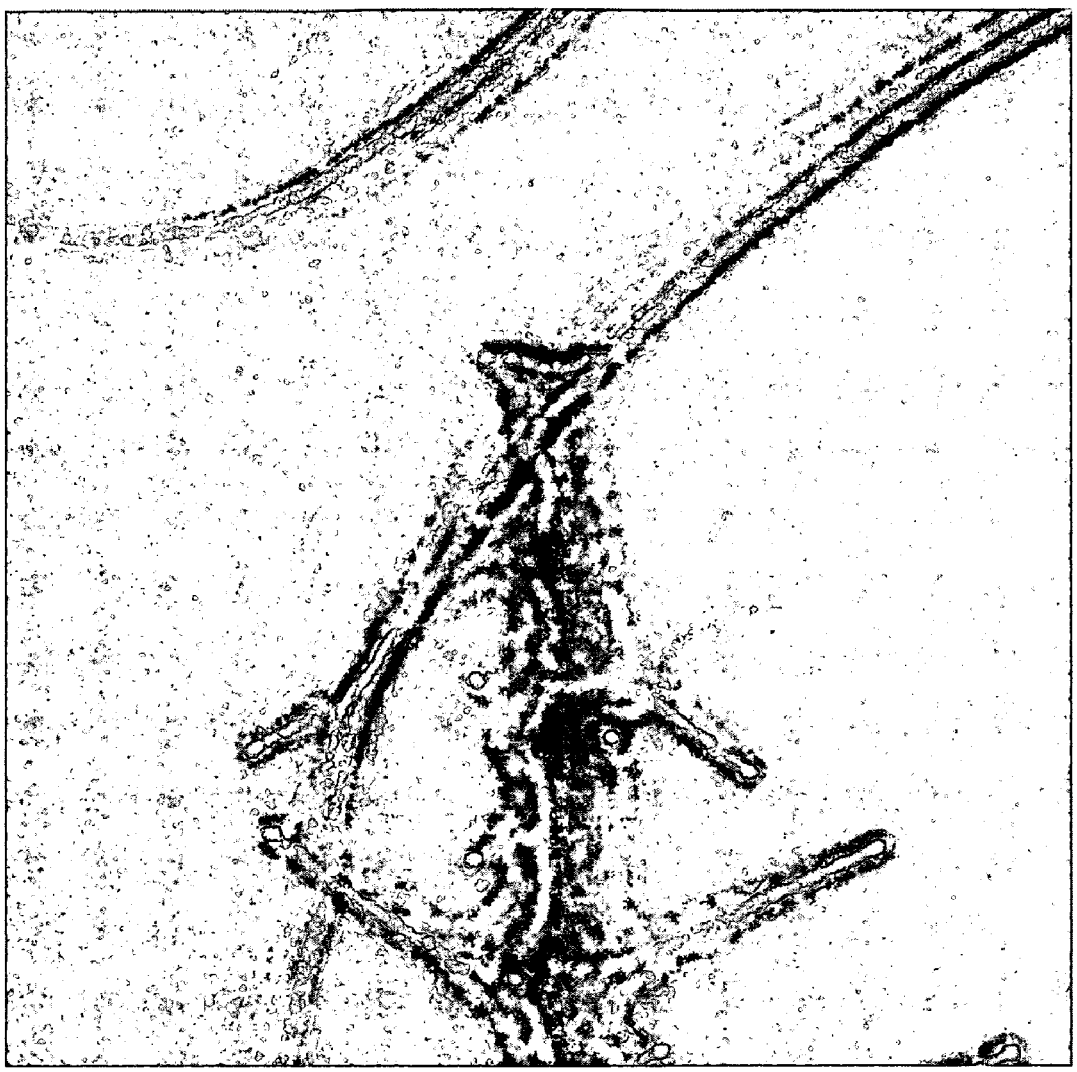
FIG. 4 shows a transmission electron microscopic (TEM) image of a GaN nanotree with nanotube branches.
Figure 5:
FIG. 5 shows a transmission electron microscopic (TEM) image of a GaN nanotree with nanowire branches.

FIG. 4 is a transmission electron microscopic (TEM) image of an exemplary GaN nanotree with nanotube branches grown on a nanowire "trunk", as described above in Example 4, at a growth temperature of 900° C. FIG. 5 is a transmission electron microscopic (TEM) image of an exemplary GaN nanotree with nanowire branches grown on a nanowire "trunk" at a growth temperature of 950° C. As mentioned above, the GaN nanotubes are expected to have a smaller direct optical bandgap than the GaN nanowire "trunk", thereby absorbing over a broader range of the optical spectrum than either nanotubes or nanowires alone, without the addition of dopants or forming an alloy, such as GaInN.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. A method for producing GaN nanotubes, comprising:
providing a framework of a mesoporous siliceous structure having pores with a predetermined pore diameter and containing a catalytic metal dispersed in the mesoporous siliceous framework so as to form catalytic sites in the pores, with a size of the catalytic sites determined by a quantity of catalytic metal ions in the mesoporous siliceous framework, and
exposing the framework to a gallium-containing reactant and a nitrogen-containing reactant at a predetermined temperature,
thereby producing the GaN nanotubes with a diameter or cross-sectional area that correlates with the predetermined pore diameter.

2. The method of claim 1, wherein the catalytic metal is selected from one of Group 8, Group 9 and Group 10 of the periodic table.

3. The method of claim 1, wherein the catalytic metal dispersed in the pores has a concentration between 0.1 and 10 wt %.

4. The method of claim 1, wherein the catalytic metal dispersed in the pores has a concentration between 0.5 and 5 wt %.

5. The method of claim 1, wherein the catalytic metal comprises at least one element selected from the group consisting of Fe, Co and Ni.

6. The method of claim 1, wherein the catalytic metal comprises Ni.

7. The method of claim 1, wherein the mesoporous siliceous structure comprises a hexagonal arrangement of uniformly sized pores.

8. The method of claim 1, wherein the predetermined pore diameter is between 1 nm and 10 nm.

9. The method of claim 1, wherein the gallium-containing reactant comprises gallium metal.

10. The method of claim 1, wherein the gallium-containing reactant comprises a metalorganic compound selected from the group consisting of trimethyl-gallium, triethyl-gallium, and gallium acetyl acetonate.

11. The method of claim 1, wherein the nitrogen-containing reactant comprises ammonia ($NH_3$).

12. The method of claim 1, wherein the predetermined temperature is in a range between approximately 750° C. and 950° C.

13. The method of claim 1, wherein the diameter or cross-sectional area of the nanotubes is substantially identical to the predetermined pore diameter.

14. The method of claim 1, further including the step of exposing the framework to hydrogen before exposing the framework to the gallium-containing and nitrogen-containing reactants.

15. The method of claim 1, wherein the gallium-containing reactant comprises a gallium halide.

16. The method of claim 15, wherein the gallium-containing reactant comprises $GaCl_3$.

17. The method of claim 1, wherein providing the framework includes the steps of preparing a mixture of the mesoporous siliceous structure with boehmite ($\gamma$-AlOOH), placing the mixture on a support, and calcining the supported mixture.

18. The method of claim 17, wherein the support comprises a silicon wafer.

19. The method of claim 1, further including, at a temperature less than the predetermined temperature, exposing the produced GaN nanotubes to a metalorganic indium-containing reactant, a metalorganic gallium-containing reactant and the nitrogen-containing reactant, thereby producing a GaN dendritic structure that includes one or more nanotubes originating from a site located along a free section of the produced GaN nanotubes.

20. The method of claim 19 further including exposing the produced GaN nanotubes to at least one of indium vapor, and gallium vapor, and thereafter exposing the produced GaN nanotubes to a metalorganic gallium-containing reactant and the nitrogen-containing reactant to produce the GaN dendritic structure.

21. The method of claim 20, wherein the framework is exposed to the indium or gallium vapor at a temperature between 750° C. and 1000° C.

22. The method of claim 21, further including adding a metalorganic indium-containing reactant to the metalorganic gallium-containing reactant.

* * * * *